(12) United States Patent
Yoshida et al.

(10) Patent No.: US 10,319,524 B2
(45) Date of Patent: Jun. 11, 2019

(54) THIN-FILM CAPACITOR

(71) Applicant: TDK CORPORATION, Tokyo (JP)

(72) Inventors: Kenichi Yoshida, Tokyo (JP);
Kazuhiro Yoshikawa, Tokyo (JP);
Michihiro Kumagae, Tokyo (JP);
Norihiko Matsuzaka, Tokyo (JP);
Junki Nakamoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/725,654

(22) Filed: Oct. 5, 2017

(65) Prior Publication Data
US 2018/0102218 A1 Apr. 12, 2018

(30) Foreign Application Priority Data
Oct. 11, 2016 (JP) .................. 2016-199914

(51) Int. Cl.
H01G 4/30 (2006.01)
H01G 4/232 (2006.01)
(Continued)

(52) U.S. Cl.
CPC ............ H01G 4/30 (2013.01); H01G 4/232 (2013.01); H01G 4/306 (2013.01); H01G 4/33 (2013.01);
(Continued)

(58) Field of Classification Search
CPC ............ H01G 4/33; H01G 4/30; H01G 4/306; H01G 4/06
(Continued)

(56) References Cited

U.S. PATENT DOCUMENTS 4,842,893 A 6/1989 Yializis et al.
5,018,048 A 5/1991 Shaw et al.
(Continued)

FOREIGN PATENT DOCUMENTS

JP S55-091112 A 7/1980
JP S63-072108 A 4/1988
(Continued)

OTHER PUBLICATIONS

U.S. Appl. No. 15/725,860, filed Oct. 5, 2017 in the name of Kumagae et al.
(Continued)

Primary Examiner — Eric W Thomas
(74) Attorney, Agent, or Firm — Oliff PLC

(57) ABSTRACT

A thin-film capacitor includes electrode layers stacked in a stacking direction; dielectric layers stacked between the electrode layers; an opening portion that includes a side surface penetrating at least a part of the electrode layers and at least a part of the dielectric layers in the stacking direction from a top side and a bottom surface exposing one of the electrode layers; and a wiring portion disposed in the opening portion to be separated from the side surface of the opening portion, and electrically connected to the electrode layer exposed from the bottom surface of the opening portion. The dielectric layer that is stacked immediately on the electrode layer exposed from the bottom surface of the opening portion among the dielectric layers includes an extension portion extending in the opening portion from the side surface of the opening portion to the wiring portion side.

5 Claims, 8 Drawing Sheets

(51) Int. Cl.
*H01G 4/33* (2006.01)
*H01L 23/522* (2006.01)
*H01L 27/01* (2006.01)
*H01L 49/02* (2006.01)

(52) U.S. Cl.
CPC ........ *H01L 23/5223* (2013.01); *H01L 27/016* (2013.01); *H01L 28/40* (2013.01); *H01L 28/91* (2013.01); *H01L 2224/05001* (2013.01); *H01L 2224/05027* (2013.01)

(58) Field of Classification Search
USPC ..................................................... 361/301.4
See application file for complete search history.

(56) References Cited

U.S. PATENT DOCUMENTS

| | | | |
|---|---|---|---|
| 5,032,461 | A | 7/1991 | Shaw et al. |
| 5,097,800 | A | 3/1992 | Shaw et al. |
| 5,125,138 | A | 6/1992 | Shaw et al. |
| 5,745,335 | A | 4/1998 | Watt |
| 6,034,864 | A | 3/2000 | Naito et al. |
| 6,134,098 | A | 10/2000 | Kuroda et al. |
| 6,370,011 | B1 | 4/2002 | Naito et al. |
| 6,411,494 | B1 | 6/2002 | Watt |
| 6,462,932 | B1 | 10/2002 | Naito et al. |
| 6,549,395 | B1 | 4/2003 | Naito et al. |
| 6,724,611 | B1 | 4/2004 | Mosley |
| 8,343,361 | B2 * | 1/2013 | Takeshima ............. H01G 4/228 216/13 |
| 2002/0109958 | A1 | 8/2002 | Naito et al. |
| 2004/0099999 | A1 | 5/2004 | Borland |
| 2004/0108134 | A1 | 6/2004 | Borland et al. |
| 2004/0125539 | A1 | 7/2004 | Murakami et al. |
| 2004/0201367 | A1 | 10/2004 | Echigo et al. |
| 2004/0231885 | A1 | 11/2004 | Borland et al. |
| 2004/0233611 | A1 | 11/2004 | Borland |
| 2005/0063135 | A1 | 3/2005 | Borland et al. |
| 2005/0121772 | A1 | 6/2005 | Hayashi et al. |
| 2005/0195554 | A1 | 9/2005 | Borland et al. |
| 2005/0269287 | A1 | 12/2005 | Tsujimura et al. |
| 2005/0287755 | A1 | 12/2005 | Bachmann et al. |
| 2006/0196599 | A1 | 9/2006 | Satou |
| 2008/0145996 | A1 | 6/2008 | Nomura et al. |
| 2009/0017591 | A1 | 1/2009 | Cervin-Lawry et al. |
| 2009/0283819 | A1 | 11/2009 | Ishikawa et al. |
| 2010/0044831 | A1 | 2/2010 | Guegan |
| 2010/0252527 | A1 | 10/2010 | Takeshima et al. |
| 2012/0262836 | A1 | 10/2012 | Chai |
| 2013/0048596 | A1 | 2/2013 | Komuro et al. |
| 2013/0258796 | A1 | 10/2013 | Hioka et al. |
| 2015/0093497 | A1 | 4/2015 | Koutsaroff et al. |
| 2015/0334822 | A1 | 11/2015 | Shinkawa et al. |
| 2015/0357401 | A1 | 12/2015 | Pelloquin et al. |
| 2017/0345576 | A1 | 11/2017 | Tsuyoshi et al. |

FOREIGN PATENT DOCUMENTS

| | | | |
|---|---|---|---|
| JP | S63-310156 | A | 12/1988 |
| JP | H1-120858 | A | 5/1989 |
| JP | H1-278061 | A | 11/1989 |
| JP | H03-034580 | A | 2/1991 |
| JP | H4-111462 | A | 4/1992 |
| JP | H8-078283 | A | 3/1996 |
| JP | 2000-514243 | A | 10/2000 |
| JP | 2006-510233 | A | 3/2006 |
| JP | 2014090077 | A * | 5/2014 |
| WO | 98/000871 | A1 | 1/1998 |
| WO | 2009/078225 | A1 | 6/2009 |

OTHER PUBLICATIONS

U.S. Appl. No. 15/725,571, filed Oct. 5, 2017 in the name of Takasaki et al.
Dec. 10, 2018 Office Action Issued in U.S. Appl. No. 15/725,571.
Mar. 21, 2019 Office Action issued in U.S. Appl. No. 15/725,571.

* cited by examiner

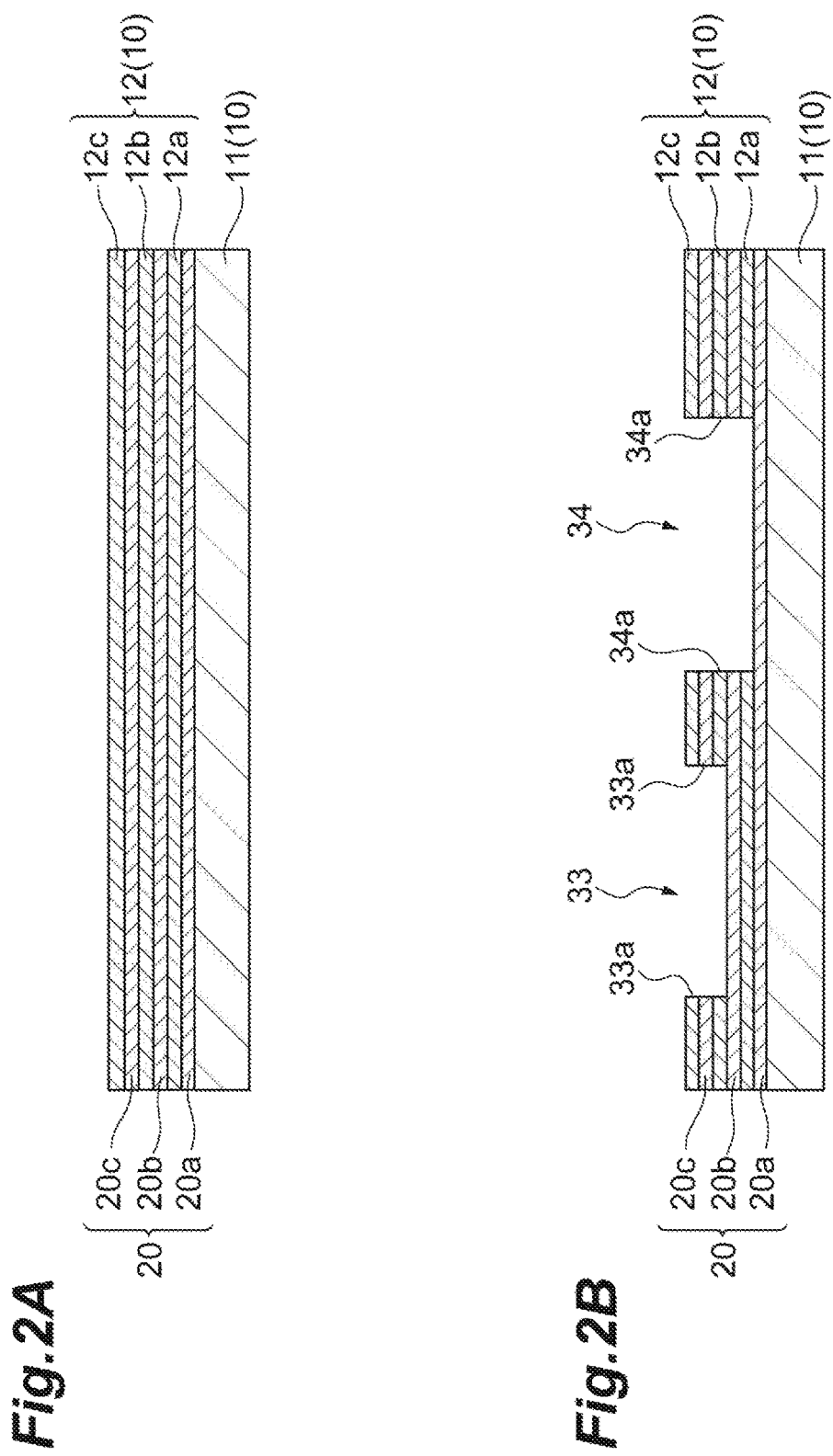

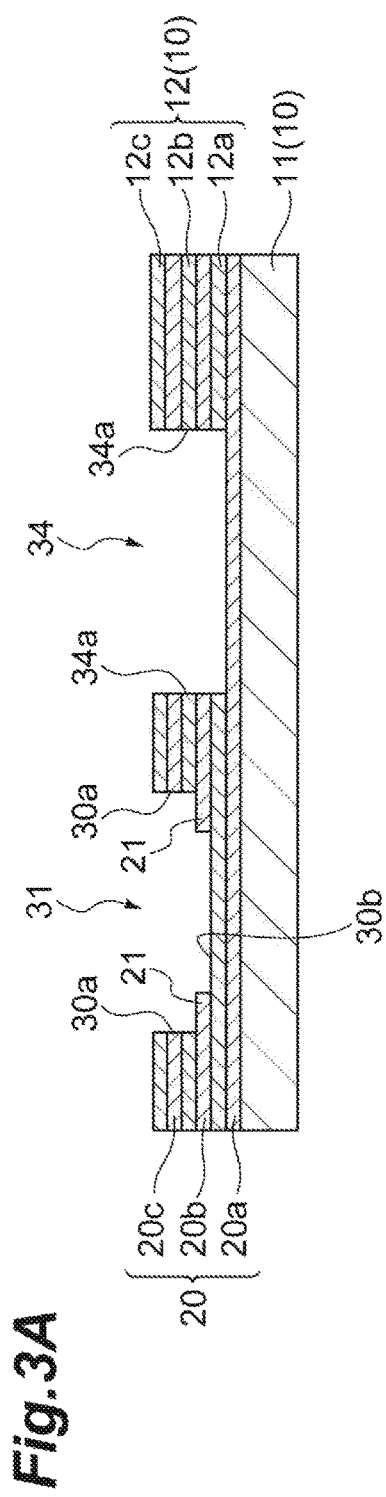
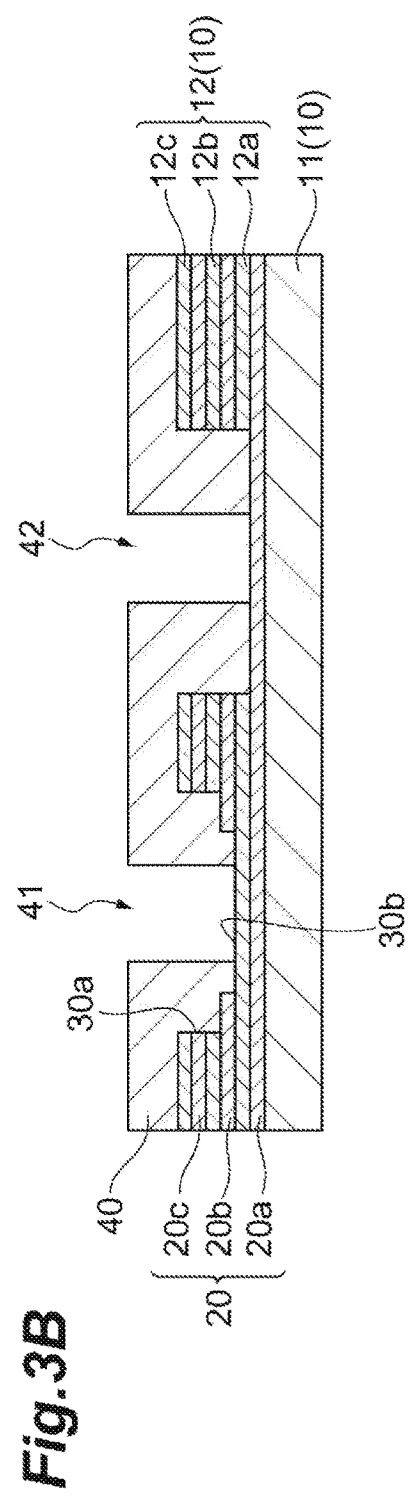

THIN-FILM CAPACITOR

TECHNICAL FIELD

The present invention relates to a thin-film capacitor.

BACKGROUND

With a decrease in size of electronic devices, a decrease in size and an improvement in functionality are required for electronic components which are used for electronic devices. For example, Japanese Unexamined Patent Publication No. 2000-514243 describes a multilayer capacitor having a structure in which materials of an electrode layer and a dielectric layer are alternately stacked.

SUMMARY

However, in such a thin-film capacitor, since an application voltage is directly applied to a dielectric layer, dielectric breakdown may be caused in the dielectric layer. There is a likelihood that this dielectric breakdown will occur particularly at an end of the dielectric layer.

The invention is made in consideration of the above-mentioned circumstances and an object thereof is to provide a thin-film capacitor that can prevent dielectric breakdown in a dielectric layer.

In order to achieve the above-mentioned object, according to an aspect of the invention, there is provided a thin-film capacitor including: a plurality of electrode layers that are stacked in a stacking direction; a plurality of dielectric layers that are stacked between the plurality of electrode layers; an opening portion that includes a side surface penetrating at least a part of the plurality of electrode layers and at least a part of the plurality of dielectric layers in the stacking direction from a top side and a bottom surface exposing one electrode layer of the plurality of electrode layers; and a wiring portion that is disposed in the opening portion to be separated from the side surface of the opening portion and is electrically connected to the electrode layer exposed from the bottom surface of the opening portion, wherein the dielectric layer that is stacked immediately on the electrode layer exposed from the bottom surface of the opening portion among the plurality of dielectric layers includes an extension portion extending in the opening portion from the side surface of the opening portion to the wiring portion side.

In this thin-film capacitor, the dielectric layer that is stacked immediately on the electrode layer electrically connected to the wiring portion includes an extension portion that extends from the side surface of the opening portion to the wiring portion side. Since no electrode layer is stacked on the extension portion, an electric field in a direction parallel to the stacking direction is not formed in the extension portion. Accordingly, a polarization domain that is polarized in a direction intersecting the stacking direction is formed in the extension portion. The polarization domain in the direction intersecting the stacking direction acts in a direction in which a polarization domain in the stacking direction formed in the dielectric layer by an application voltage is alleviated. Accordingly, it is possible to prevent dielectric breakdown in the dielectric layer.

In the thin-film capacitor according to the aspect, a thickness of the extension portion may be smaller than a thickness of the dielectric layer stacked immediately on the electrode layer exposed from the bottom surface of the opening portion. When the thickness is set to be small in this way, a polarization domain in a direction intersecting the stacking direction is also formed in the extension portion and thus it is possible to prevent dielectric breakdown in the dielectric layer. According to this configuration, since a space can be secured above the extension portion having a small thickness, it is possible to prevent dielectric breakdown in the dielectric layer and to achieve an increase in integration of the thin-film capacitor.

In the thin-film capacitor according to the aspect, an end face of the extension portion may be inclined such that a thickness of the extension portion decreases toward the wiring portion side. When a structure in which the end face of the extension portion is inclined is employed in this way, a polarization domain in a direction intersecting the stacking direction is also formed in the extension portion and thus it is possible to prevent dielectric breakdown in the dielectric layer. According to this configuration, since a space can be secured above the extension portion having a small thickness, it is possible to prevent dielectric breakdown in the dielectric layer and to achieve an increase in integration of the thin-film capacitor.

According to the invention, it is possible to provide a thin-film capacitor that can prevent dielectric breakdown in a dielectric layer.

BRIEF DESCRIPTION OF THE DRAWINGS

FIGS. 2A and 2B are diagrams illustrating a method of manufacturing the thin-film capacitor illustrated in FIG. 1;

FIGS. 3A and 3B are diagrams illustrating a method of manufacturing the thin-film capacitor illustrated in FIG. 1;

DETAILED DESCRIPTION

Figure 1:
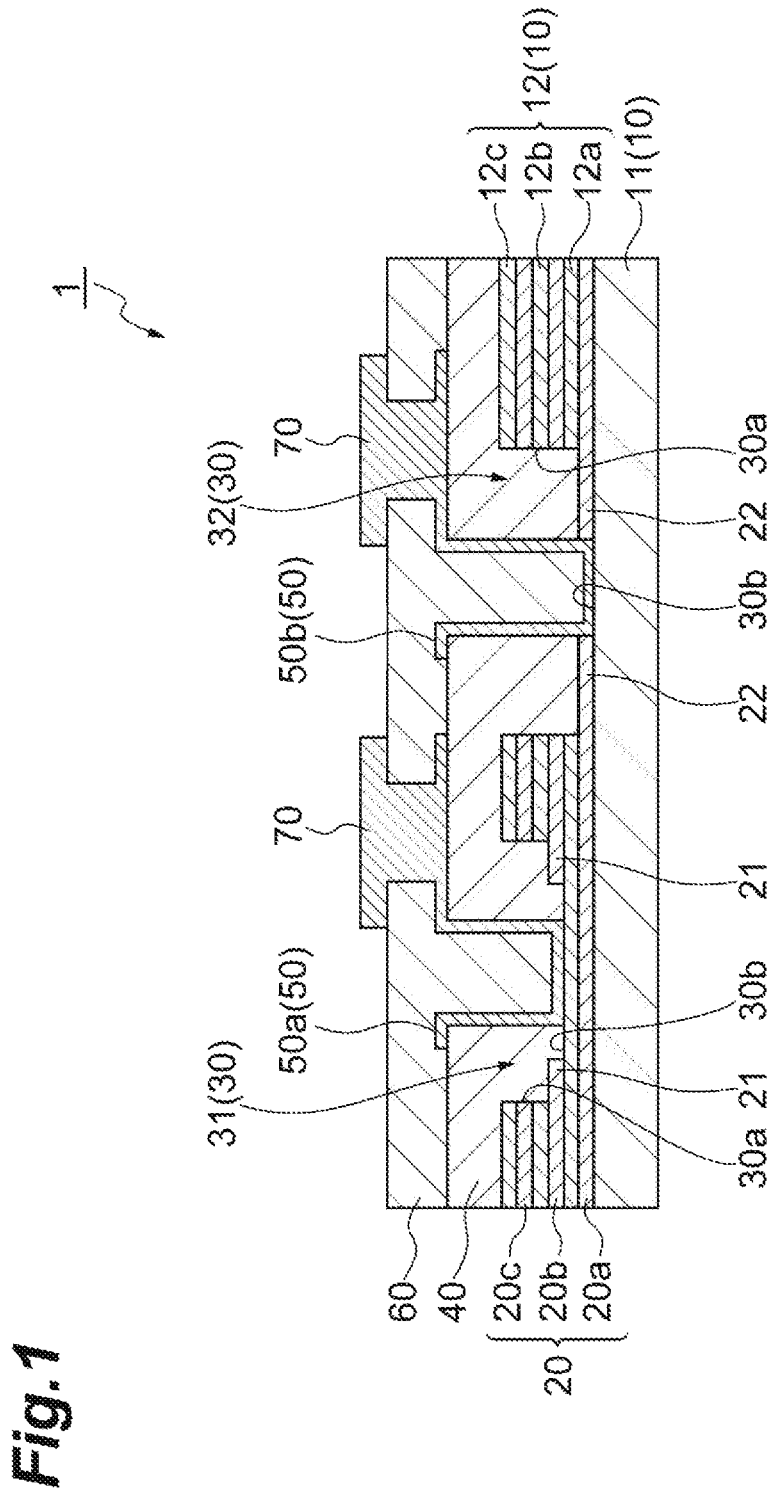
FIG. 1 is a cross-sectional view schematically illustrating a part of a thin-film capacitor according to an embodiment of the invention.

Hereinafter, various embodiments of the invention will be described in detail with reference to the accompanying drawings. In the drawings, the same or corresponding elements will be referenced by the same reference signs and description thereof will not be repeated.

FIG. 1 is a cross-sectional view schematically illustrating a part of a thin-film capacitor according to an embodiment of the invention. As illustrated in FIG. 1, the thin-film capacitor 1 according to this embodiment includes a plurality of electrode layers 10 that are stacked, a plurality of dielectric layers 20 that are stacked between the plurality of electrode layers 10, opening portions 30 (31 and 32) each including a side surface 30a penetrating at least a part of the plurality of electrode layers 10 and at least a part of the plurality of dielectric layers 20 in the stacking direction from the top side and a bottom surface 30b exposing one electrode layer 10 of the plurality of electrode layers 10, and a wiring portion 50 that is disposed in the opening portion 30 to be separated from the side surface 30a of the opening portion 30 and is electrically connected to the electrode layer 10 exposed from the bottom surface 30b of the opening portion 30. The thin-film capacitor 1 further includes a first insulating layer 40 that is stacked on the electrode layers 10 and the dielectric layers 20 to bury the opening portion 30, a second insulating layer 60 that is stacked on the first insulating layer 40 and the wiring portion 50, and an external terminal 70 that penetrates the second insulating layer 60 and is electrically connected to the wiring portion 50.

The electrode layers 10 include a base electrode layer 11 and internal electrode layers 12. The internal electrode layers 12 and the dielectric layers 20 are alternately stacked on the base electrode layer 11. The thin-film capacitor 1 includes at least two internal electrode layers 12, a base electrode layer 11 and at least two dielectric layers 20 as the smallest unit. In this embodiment, the thin-film capacitor 1 includes three internal electrode layers 12a, 12b, and 12c and three dielectric layers 20a, 20b, and 20c. That is, in this embodiment, the thin-film capacitor 1 includes four electrode layers and three dielectric layers. The internal electrode layers 12a, 12b, and 12c and the dielectric layers 20a, 20b, and 20c are stacked on the base electrode layer 11 in the order of the internal electrode layer 12a, the dielectric layer 20a, the internal electrode layer 12b, the dielectric layer 20b, the internal electrode layer 12c, and the dielectric layer 20c.

The thin-film capacitor 1 includes two opening portions 31 and 32. In the opening portion 31, the dielectric layer 20a, the internal electrode layer 12b, the dielectric layer 20b, the internal electrode layer 12c, and the dielectric layer 20c are exposed from the side surface 30a, and the internal electrode layer 12a is exposed from the bottom surface 30b. The side surface 30a of the opening portion 31 has a continuous plane shape. That is, end faces of the dielectric layer 20a, the internal electrode layer 12b, the dielectric layer 20b, the internal electrode layer 12c, and the dielectric layer 20c constituting the side surface 30a are continuous in the stacking direction and have only unevenness corresponding to thicknesses of the layers. Accordingly, a stepped portion is hardly formed on the side surface 30a. In the opening portion 32, the internal electrode layer 12a, the dielectric layer 20a, the internal electrode layer 12b, the dielectric layer 20b, the internal electrode layer 12c, and the dielectric layer 20c are exposed from the side surface 30a, and the base electrode layer 11 is exposed from the bottom surface 30b. The side surface 30a of the opening portion 32 has a continuous plane shape. The wiring portion 50 includes a first wiring portion 50a and a second wiring portion 50b, the first wiring portion 50a is electrically connected to the internal electrode layer 12a of the bottom surface in the opening portion 31, and the second wiring portion 50b is electrically connected to the base electrode layer 11 of the bottom surface in the opening portion 32. Accordingly, the internal electrode layer 12a, the dielectric layer 20a, and the base electrode layer 11 constitute one capacitor.

In this specification, the "stacking direction" refers to a direction in which the layers such as the base electrode layer 11, the dielectric layer 20a, and the internal electrode layer 12a are sequentially superimposed from the base electrode layer 11 to the second insulating layer 60. The top side in the stacking direction refers to the second insulating layer 60 side, and the bottom side in the stacking direction refers to the base electrode layer 11 side.

In the thin-film capacitor 1, the dielectric layer 20 stacked immediately on the electrode layer 10 exposed from the bottom surface 30b of the opening portion 30 includes an extension portion that extends from the side surface 30a of the opening portion 30 to the wiring portion 50 side. Specifically, in the opening portion 31, the dielectric layer 20b stacked immediately on the internal electrode layer 12a which is exposed from the bottom surface 30b and is electrically connected to the first wiring portion 50a includes an extension portion 21. In the opening portion 32, the dielectric layer 20a stacked immediately on the base electrode layer 11 which is exposed from the bottom surface 30b and is electrically connected to the second wiring portion 50b includes an extension portion 22. The extension portion 21 of the dielectric layer 20b does not reach the first wiring portion 50a, and the first insulating layer 40 is disposed between the extension portion 21 of the dielectric layer 20b and the first wiring portion 50a. The extension portion 22 of the dielectric layer 20a reaches a position in contact with the second wiring portion 50b.

The base electrode layer 11 is formed of a conductive material.

Specifically, an alloy including nickel (Ni) or platinum (Pt) as a main component can be preferably used as the conductive material of the base electrode layer 11, and particularly an alloy including Ni as a main component can be suitably used. The purity of Ni in the base electrode layer 11 is preferably high and is more preferably equal to or greater than 99.99 wt %. Traces of impurities may be included in the base electrode layer 11. Examples of the impurities which can be included in the base electrode layer 11 formed of an alloy including Ni as a main component include a transition metal element or rare earth element such as iron (Fe), titanium (Ti), copper (Cu), aluminum (Al), magnesium (Mg), manganese (Mn), silicon (Si), chromium (Cr), vanadium (V), zinc (Zn), niobium (Nb), tantalum (Ta), yttrium (Y), lanthanum (La), or cesium (Ce), or chlorine (Cl), sulfur (S), or phosphorus (P).

The thickness of the base electrode layer 11 preferably ranges from 10 nm to 100 µm, more preferably ranges from 1 µm to 70 µm, and still more preferably ranges from 10 µm to 30 µm. When the thickness of the base electrode layer 11 is excessively small, there is a tendency for the base electrode layer 11 to be difficult to handle at the time of manufacturing the thin-film capacitor 1. When the thickness of the base electrode layer 11 is excessively large, there is a tendency for an effect of suppressing a leak current to be reduced. The area of the base electrode layer 11 is, for example, about 1×0.5 mm$^2$ The base electrode layer 11 is preferably formed of a metal foil and is used together as a substrate and an electrode. In this way, it is preferable that the base electrode layer 11 in this embodiment be configured to be also used as a substrate, but a substrate/electrode film structure in which the base electrode layer 11 is formed on a substrate formed of Si, alumina, or the like may be employed.

The internal electrode layers 12 (12a, 12b, and 12c) are formed of a conductive material. Specifically, a material including nickel (Ni) or platinum (Pt) as a main component can be preferably used as the conductive material of the internal electrode layers 12, and particularly a material including Ni as a main component can be suitably used. When a material including Ni as a main component is used for the internal electrode layers 12, the content thereof is preferably equal to or greater than 50 mol % with respect to the whole internal electrode layers 12. When a main component of the internal electrode layers 12 is Ni, at least a kind (hereinafter referred to as an "additive element") selected from a group consisting of platinum (Pt), palladium (Pd), iridium (Ir), rhodium (Rh), ruthenium (Ru), osmium (Os), rhenium (Re), tungsten (W), chromium (Cr), tantalum (Ta), and silver (Ag) is additionally added. Since the internal electrode layers 12 include an additive element, breakage of the internal electrode layers 12 is prevented. The internal electrode layers 12 may include a plurality of kinds of additive elements. The thicknesses of the internal electrode layers 12 range, for example, from 10 nm to 1000 nm.

The dielectric layers 20 (the dielectric layers 20a, 20b, and 20c) are formed of a (ferroelectric) dielectric material having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, or $Pb(Zr_xTi_{1-x})O_3$, a complex perovskite relaxer type ferroelectric material such as $Pb(Mg_{1/3}Nb_{2/3})O_3$, a bismuth-layered compound such as $Bi_4Ti_3O_{12}$ or $SrBi_2Ta_2O_9$, a tungsten-bronze type ferroelectric material such as $(Sr_{1-x}Ba_x)Nb_2O_6$ or $PbNb_2O_6$, or the like. Here, in the perovskite structure, the complex perovskite relaxer type ferroelectric material, the bismuth-layered compound, and the tungsten-bronze type ferroelectric material, a ratio of A site and B site is normally an integer ratio, but may be intentionally deviated from the integer ratio for the purpose of improvement in characteristics. In order to control characteristics of the dielectric layers 20, additives may be appropriately added as a secondary component to the dielectric layers 20. The thicknesses of the dielectric layers 20 range, for example, from 10 nm to 1000 nm.

The materials of the first insulating layer 40 and the second insulating layer 60 are not particularly limited as long as they are insulating materials, and a non-conductive resin such as polyimide, an inorganic material such as $SiO_2$, alumina, or SiN (silicon nitride), or an insulating material in which they are mixed or stacked may be used. The thickness of the first insulating layer 40 (a distance between the top surface of the internal electrode layer 12c and the top surface of the first insulating layer 40) ranges, for example, from 0.5 μm to 10 μm, and the thickness of the second insulating layer 60 (a distance between the top surface of the first insulating layer 40 and the top surface of the second insulating layer 60) ranges, for example, from 0.5 μm to 10 μm.

The wiring portion 50 is formed of a material having conductivity such as copper (Cu). The external terminal 70 that is electrically connected to the wiring portion 50 is also formed of a material having conductivity such as copper (Cu).

The diameter of the opening portions 31 and 32 (the diameter of an area surrounded with the side surface 30a) into which the first insulating layer 40 is introduced is not particularly limited, and is set such that the wiring portion 50 is separated from the side surface 30a of the opening portions 31 and 32 (that is, such that the first insulating layer 40 is disposed between the wiring portion 50 and the side surface 30a) and such that the above-mentioned extension portions 21 and 22 are formed. It is preferable that the length of the extension portions 21 and 22 (a maximum length of portions protruding from the side surfaces 30a of the opening portions 31 and 32) be two or more times the thickness of the dielectric layers 20 in which the extension portions 21 and 22 are disposed.

A method of manufacturing the thin-film capacitor 1 will be described below with reference to FIGS. 2A to 5B. FIGS. 2A to 5B are diagrams illustrating a method of manufacturing the thin-film capacitor illustrated in FIG. 1. FIGS. 2A to 4 are enlarged views of a part of the thin-film capacitor 1 in the steps of the manufacturing method. For example, a plurality of thin-film capacitors 1 are formed at a time and then are diced into individual thin-film capacitors 1.

First, as illustrated in FIG. 2A, a metal foil which becomes the base electrode layer 11 is prepared, and the dielectric layer 20a, the internal electrode layer 12a, the dielectric layer 20b, the internal electrode layer 12b, the dielectric layer 20c, and the internal electrode layer 12c are sequentially formed on the base electrode layer 11. The metal foil which becomes the base electrode layer 11 is polished such that the surface thereof has predetermined arithmetic mean roughness Ra if necessary. This polishing can be performed using a method such as chemical mechanical polishing (CMP), electrolytic polishing, or buff polishing. A film forming technique such as a physical vapor deposition (PVD) method such as a solution method or a sputtering method or a chemical vapor deposition (CVD) method can be used as the method of forming the dielectric layers 20a, 20b, and 20c, and the sputtering method can be more preferably used. A DC sputtering method or the like can be used as the method of forming the internal electrode layers 12a, 12b, and 12c.

Then, as illustrated in FIG. 2B, openings 33 and 34 which become the opening portions 30 (31, and 32) penetrating the internal electrode layers 12 and the dielectric layers 20 are formed. The openings 33 and 34 are formed, for example, by dry etching using a patterned resist as a mask. Through this step, two openings 33 and 34 are formed in the internal electrode layers 12 and the dielectric layers 20. In the opening 33, the dielectric layer 20b is exposed from the bottom surface, and a continuous side surface 33a is formed by the internal electrode layers 12b and 12c and the dielectric layer 20c. In the opening 34, the dielectric layer 20a is exposed from the bottom surface, and a continuous side surface 34a is formed by the internal electrode layers 12a, 12b, and 12c and the dielectric layers 20b and 20c. As a result, the side surface 30a penetrating the internal electrode layers 12 and the dielectric layers 20 are formed.

Thereafter, a stacked body in which the internal electrode layers 12 and the dielectric layers 20 are stacked on the base electrode layer 11 is baked. The baking temperature is preferably set to a temperature at which the dielectric layers are sintered (crystallized) and preferably ranges from 500° C. to 1000° C. The baking time can be set to 5 minutes to two hours. The baking atmosphere is not particularly limited, and may be any one of an oxidizing atmosphere, a reducing atmosphere, and a neutral atmosphere. It is preferable that the baking be performed in at least an oxygen partial pressure in which the electrode layers 10 are not oxidized. Accordingly, the dielectric layers are formed. The baking timing is not limited to the above-mentioned timing, and baking may be performed, for example, before the openings 33 and 34 are formed or may be performed after the openings 33 and 34 are formed.

Then, as illustrated in FIG. 3A, a part of the dielectric layer 20b exposed from the bottom surface of the opening 33 is removed. The removing of the dielectric layer 20b is performed, for example, by dry etching using a patterned resist as a mask. The width of the opening of the mask which is used at that time is set to be smaller than the width of the opening 33. Through this step, the extension portion 21 extending (protruding) from the side surface 33a of the opening 33 to the inside of the opening 33 is formed in the dielectric layer 20b to form the opening portion 31. The side surface 30a of the opening portion 31 is the same as the side surface 33a of the opening 33. A part of the internal electrode layer 12a is exposed from the bottom surface 30b of the opening portion 31.

Then, as illustrated in FIG. 3B, the first insulating layer 40 is formed on the internal electrode layer 12 and the dielectric layer 20. The first insulating layer 40 is formed, for example, by applying a thermosetting resin in a non-cured state and then curing the thermosetting resin by heating. The first insulating layer 40 may be formed by applying a photo-curable resin in a non-cured state and then curing the photo-curable resin by irradiation with light of a specific wavelength. After the insulating material of the first insulating layer 40 is cured, two openings 41 and 42 for forming the wiring portions 50 are formed by dry etching. The opening 41 is formed in the vicinity of the center of the opening portion 31 to penetrate the first insulating layer 40 in the opening portion 31. The opening 42 is formed in the vicinity of the center of the opening 34 to penetrate the first insulating layer 40 in the opening 34. Through this step, the internal electrode layer 12a is exposed from the bottom surface of one opening 41. The dielectric layer 20a is exposed from the bottom surface of the other opening 42. The internal electrode layers 12b and 12c and the dielectric layers 20b and 2c are sealed by the first insulating layer 40.

Figure 4:
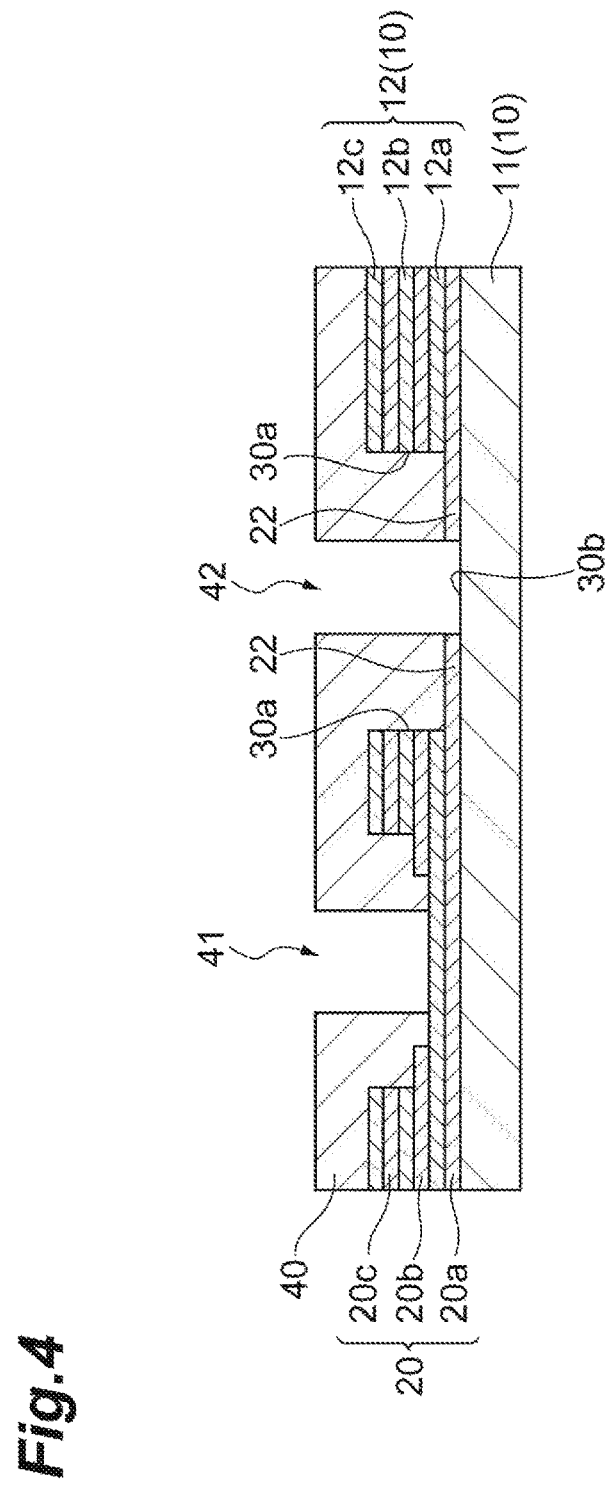
FIG. 4 is a diagram illustrating a method of manufacturing the thin-film capacitor illustrated in FIG. 1.

Then, as illustrated in FIG. 4, the dielectric layer 20a exposed from the opening 42 of the first insulating layer 40 is removed. The removing of the dielectric layer 20a is performed, for example, by dry etching using the first insulating layer 40 as a mask. Through this step, the opening portion 32 is formed. The side surface 30a of the opening portion 32 is the same as the side surface 24a of the opening 34. The extension portion 21 extending from the side surface 30a is formed in the dielectric layer 20a. The base electrode layer 11 is exposed from the opening 42.

Figure 5A:
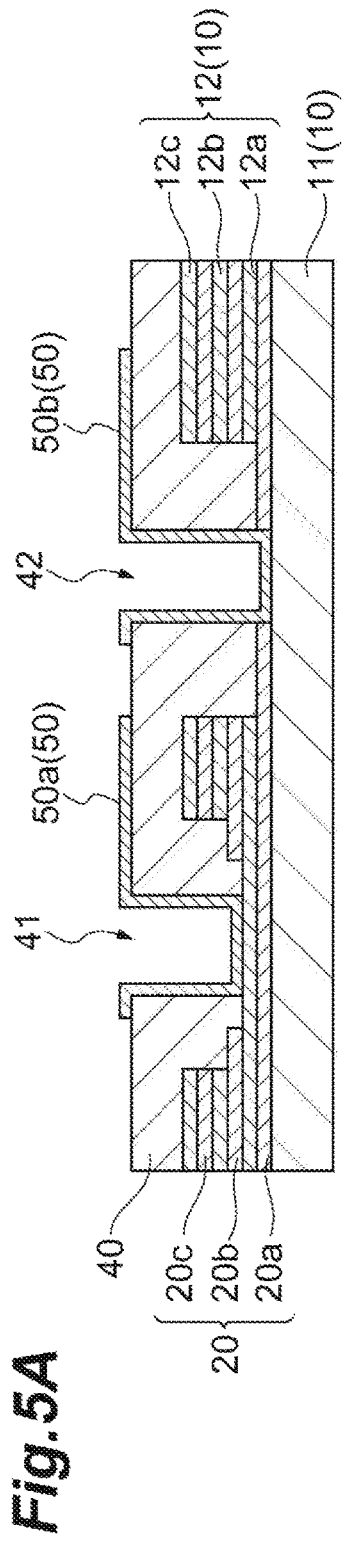
FIGS. 5A and 5B are diagrams illustrating a method of manufacturing the thin-film capacitor illustrated in FIG. 1.

Then, as illustrated in FIG. 5A, the wiring portions 50 are formed in the openings 41 and 42 of the first insulating layer 40 and on the first insulating layer 40. The wiring portion 50 is formed, for example, by sputtering or depositing a conductive material such as copper (Cu) and then performing patterning by etching. Through this step, the first wiring portion 50a and the second wiring portion 50b which are electrically isolated from each other are formed. At this time, the first wiring portion 50a is electrically connected to the internal electrode layer 12a, and the second wiring portion 50b is electrically connected to the base electrode layer 11.

Figure 5B:
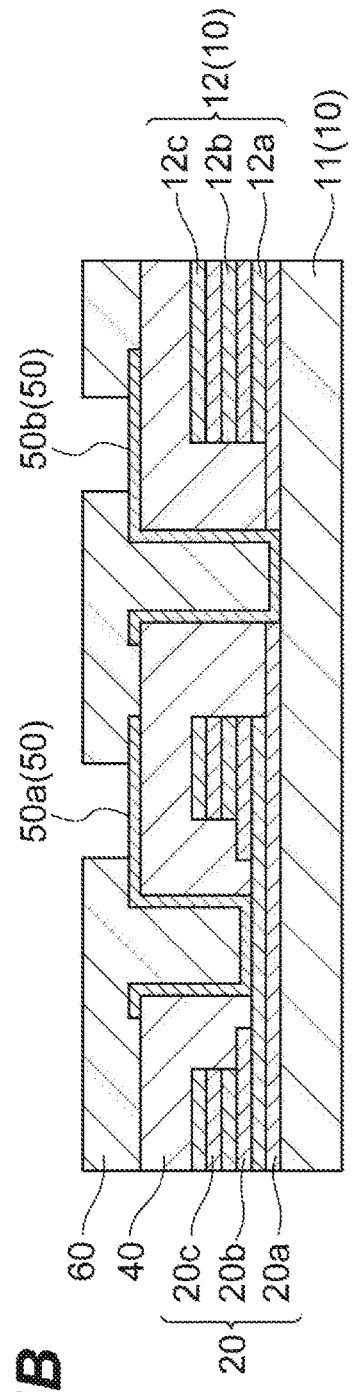

Then, as illustrated in FIG. 5B, the second insulating layer 60 is formed on the first insulating layer 40 and the wiring portion 50. Similar to the first insulating layer 40, the second insulating layer 60 is formed, for example, by applying a thermosetting resin in a non-cured state and then curing the thermosetting resin by heating. After the insulating material of the second insulating layer 60 is cured, two openings 60a for forming the external terminals 70 are formed by dry etching. Through this step, the first wiring portion 50a is exposed from one opening 60a, and the second wiring portion 50b is exposed from the other opening 60a.

Finally, the external terminal 70 for electrically connecting the thin-film capacitor 1 to an external electronic component is formed. The external terminal 70 is formed, for example, by forming a layer of a conductive material such as copper (Cu) by plating or the like and then performing etching or the like. Through this step, the openings 60a of the second insulating layer 60 are buried by the conductive material, and two external terminals 70 that are electrically connected to the first wiring portion 50a or the second wiring portion 50b are formed. Thereafter, by dividing the resultant structure into individual thin-film capacitors by dicing or the like, the thin-film capacitor 1 illustrated in FIG. 1 is obtained.

Figure 6A:
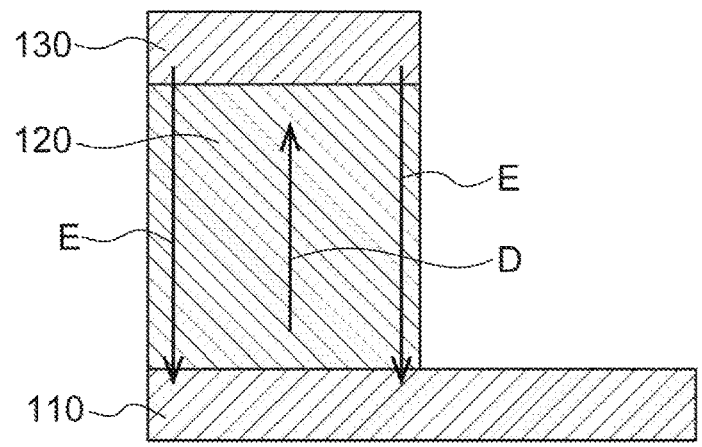
FIG. 6A is a cross-sectional view schematically illustrating a part of a thin-film capacitor according to a modified example and FIG. 6B is a cross-sectional view schematically illustrating a part of the thin-film capacitor illustrated in FIG. 1.
Figure 6B:
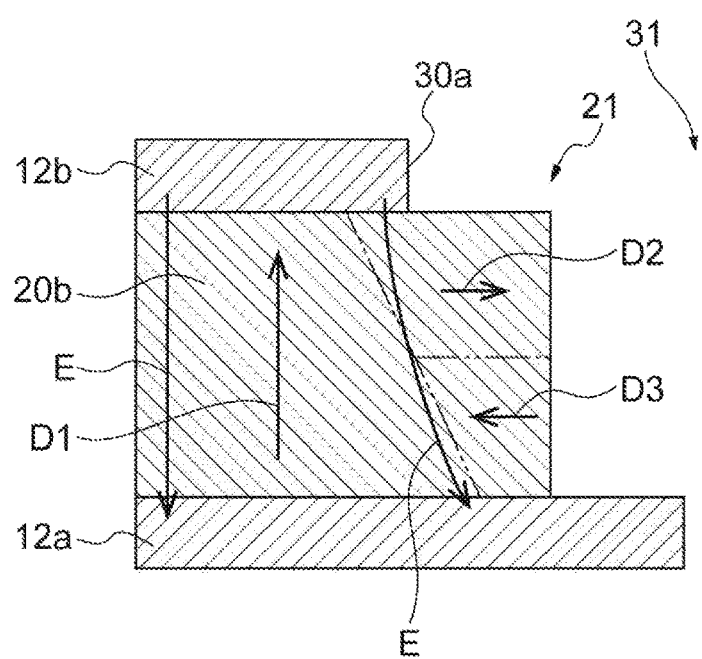

The operation of the extension portions 21 and 22 which are disposed in the dielectric layers 20 will be described below with reference to FIGS. 6A and 6B. The inventor et al. has studied the operation from which the advantageous effects of the invention are obtained as follows. FIG. 6A is a cross-sectional view schematically illustrating a part of a conventional thin-film capacitor according to a comparative example, and FIG. 6B is a cross-sectional view schematically illustrating a part of the thin-film capacitor illustrated in FIG. 1. The operation of the extension portion 21 disposed in the opening portion 31 will be described below with reference to FIG. 6B.

In the thin-film capacitor according to the comparative example illustrated in FIG. 6A, a dielectric layer and an electrode layer 130 are stacked on an electrode layer 110. In the thin-film capacitor according to the comparative example illustrated in FIG. 6A, an end of the dielectric layer 120 is aligned with an end of the electrode layer 130 stacked on the dielectric layer 120 and does not include an extension portion. In this case, a single polarization domain D extending in the stacking direction is formed in the dielectric layer 120 by an electric field E in the stacking direction. In a state in which the single polarization domain D is formed in the dielectric layer 120, there is a likelihood that distortion will be present in a crystal structure in the dielectric layer 120 and thus the state is more unstable than the state in which the polarization domain D is not present. Particularly, it is considered that there is a high likelihood that the end of the dielectric layer 120 will be affected by the distortion of the crystal structure. Particularly, in a state in which the electrode layer 110 is connected to a wiring portion, it is considered that an application voltage from the wiring portion is directly applied thereto and thus polarization further progresses. Accordingly, when the single polarization domain D extending in the stacking direction is formed in the dielectric layer 120, it is considered that there is a high likelihood that dielectric breakdown will be caused at the end of the dielectric layer 120.

On the other hand, in the thin-film capacitor 1, since the dielectric layer 20 stacked immediately on the electrode layer 10 which is electrically connected to the wiring portion 50 includes the extension portions 21 and 22 extending to the wiring portion 50 side from the side surface 30a of the opening portion 30 (31 and 32), an influence of a polarization domain in the stacking direction is reduced. More specifically, as illustrated in FIG. 6B, the dielectric layer 20b includes the extension portion 21 extending from an end of the internal electrode layer 12b stacked on the dielectric layer 20b, that is, from the side surface 30a of the opening portion 31, to the first wiring portion 50a (not illustrated) side, that is, to the center side of the opening 31. In this case, the electrode layer 10 (the internal electrode layer 12b) is not stacked on the extension portion 21. Accordingly, an electric field E in the stacking direction is not formed in the extension portion 21. As a result, a polarization domain D1 which is polarized in the stacking direction is formed in an area in which the internal electrode layer 12b is stacked on the dielectric layer 20b, but polarization domains D2 and D3 which are polarized in directions intersecting the stacking direction are formed in the extension portion 21. The polarization domain D2 is a polarization domain which is directed from the side surface 30a of the opening portion 31 to the center side of the opening portion 31, and the polarization domain D3 is a polarization domain which is directed from the center side of the opening portion 31 to the side surface 30a of the opening portion 31. Since the polarization domains D2 and D3 in the directions other than that of the polarization domain D1 in the stacking direction, particularly, in the directions perpendicular to the polarization domain D1, are formed in the peripheries of the end of the dielectric layer 20b, it is possible to reduce a risk of dielectric breakdown due to formation of the single polarization domain. Accordingly, it is possible to prevent dielectric breakdown in the dielectric layer 20b.

As in the thin-film capacitor 1, the side surface 30a of the opening portion 30 (an area in which the extension portions 21 and 22 are not formed) has a continuous shape. The end faces of the layers constituting the side surface 30a of the opening portion 30 may have a discontinuous shape like a step shape. Here, when the end faces have a discontinuous shape, it is considered that the opening portion 30 increases in size and decreases in capacity. There is a likelihood that the thin-film capacitor 1 will increase in size to secure capacity. On the other hand, when the side surface 30a has a continuous shape as in the thin-film capacitor 1, it is possible to reduce a risk of dielectric breakdown and to prevent a decrease in capacity of the thin-film capacitor 1, by forming the extension portions 21 and 22 in the dielectric layer 20 which is considered to have a highest risk of dielectric breakdown.

As illustrated in FIG. 1 or FIG. 6B and the like, it is preferable that the extension portions 21 and 22 disposed in the dielectric layer 20 be in contact with the electrode layer 10 (the internal electrode layer 12a for the extension portion 21 and the base electrode layer 11 for the extension portion 22) which is electrically connected to the wiring portion 50 immediately under the dielectric layer 20. As described above, the wiring portions 50 (50a and 50b) connected to the electrode layer 10 immediately below are disposed in the opening portions 31 and 32. That is, the peripheries of the opening portions 31 and 32 are areas close to an electrical connection portion between the wiring portion 50 and the electrode layer 10 immediately below. Accordingly, it is considered that a part particularly close to the electrode layer 10 among the dielectric layers 20 disposed immediately on the electrode layer 10 is more affected by the an application voltage from the wiring portion 50. Accordingly, since the extension portions 21 and 22 are in contact with the electrode layer 10 immediately below, it is possible to alleviate the polarization domain in the stacking direction in the area of the dielectric layer 20 which is considered to be most affected and to further reduce a risk of dielectric breakdown in the dielectric layer 20.

Figure 7A:
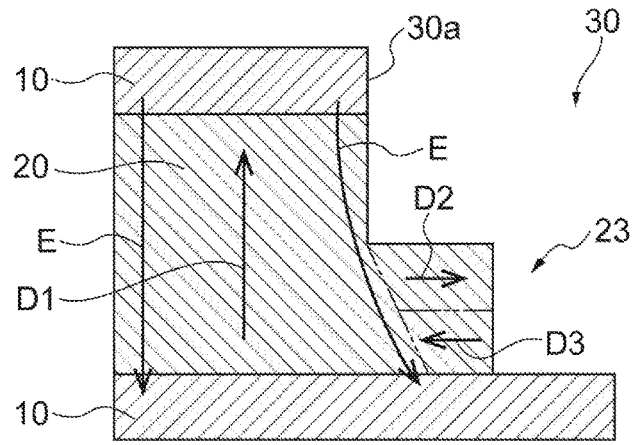
FIGS. 7A to 7C are cross-sectional views schematically illustrating modified examples of an extension portion.
Figure 7B:
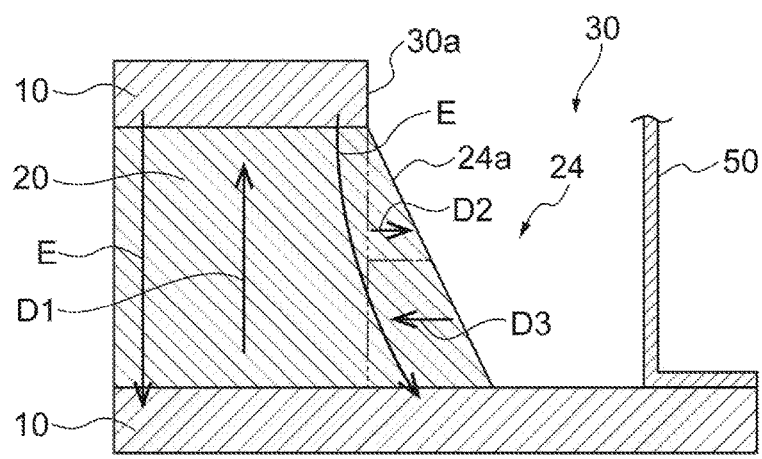
Figure 7C:
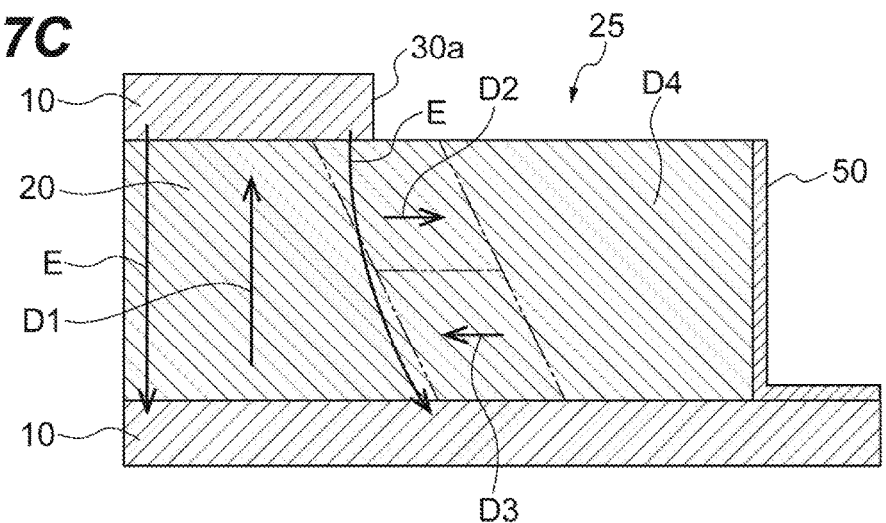

A modified example of the extension portion 21 will be described below with reference to FIGS. 7A to 7C. FIGS. 7A to 7C are cross-sectional views schematically illustrating a first modified example of the extension portion. As illustrated in FIG. 7A, the thickness of an extension portion 23 according to the first modified example is smaller than the thickness of the dielectric layer 20 which is stacked immediately on the electrode layer exposed from the bottom surface 30b of the opening portion 30. Here, the "thickness" refers to a dimension in the stacking direction. In this case, since the electrode layer 10 is not stacked on the extension portion 23, an electric field E in the stacking direction is not formed in the extension portion 23. Accordingly, a polarization domain D1 which is polarized in the stacking direction is formed in an area in which the electrode layer 10 is stacked on the dielectric layer 20, and polarization domains D2 and D3 which are polarized in directions intersecting the stacking direction are formed in the extension portion 23. Since a space can be secured on the extension portion 23 by forming the extension portion 23 in this way, it is possible to achieve an increase in integration of the thin-film capacitor 1 and to prevent dielectric breakdown in the dielectric layer 20. When the thickness of the extension portion 23 is set to be small, it is preferable that the thickness of the extension portion 23 be equal to or greater than 40% of the thickness of the dielectric layer 20 having the extension portion 23 formed therein. By setting the thickness of the extension portion 23 to the above-mentioned range, the polarization domains D2 and D3 are suitably formed in the extension portion 23.

As illustrated in FIG. 7B, an end face 24a of an extension portion 24 according to a second modified example is inclined such that the thickness of the extension portion 24 decreases toward the wiring portion 50 side. In this case, a polarization domain D1 which is polarized in the stacking direction is formed in an area in which the electrode layer 10 is stacked on the dielectric layer 20, and polarization domains D2 and D3 which are polarized in directions intersecting the stacking direction are formed in the extension portion 24.

Accordingly, it is possible to prevent dielectric breakdown in the dielectric layer 20. Such an inclined end face 24a can be formed, for example, by adjusting etching conditions of the dielectric layer 20. The inclination angle of the extension portion 24 (an angle of the end face with respect to the surface of the electrode layer 10 immediately below) is not particularly limited, but is preferably equal to or more than 10°. By setting the inclination angle of extension portion 24 to the above-mentioned range, the polarization domains D2 and D3 can be suitably formed in the extension portion 24. When the inclination angle of the extension portion 24 is less than 3°, there is a likelihood that the extension portion 24 for forming the polarization domains D2 and D3 will increase in size and there is concern that the thin-film capacitor will decrease in capacity or increase in size as a whole.

As illustrated in FIG. 7C, an extension portion 25 according to a third modified example reaches the wiring portion 50. The shape of the extension portion 25 is the same as the shape of the extension portion 22 of the thin-film capacitor 1 illustrated in FIG. 1. In this way, a configuration in which the extension portion 25 comes in contact with the wiring portion 50 may be employed. In this case, a polarization domain D1 which is polarized in the stacking direction is formed in an area in which the electrode layer 10 is stacked on the dielectric layer 20. On the other hand, polarization domains D2 and D3 which are polarized in directions intersecting the stacking direction are formed in the extension portion 25. A domain D4 which is not polarized well is formed in an area on the wiring portion 50 side of the extension portion 25. When the extension portion 25 having such a shape is formed, it is possible to more satisfactorily prevent dielectric breakdown in the dielectric layer 20. Since the number of steps for forming the extension portion 25 is less than the number of steps for forming the extension portions 21 to 24, it is possible to easily manufacture the thin-film capacitor 1.

Figure 8:
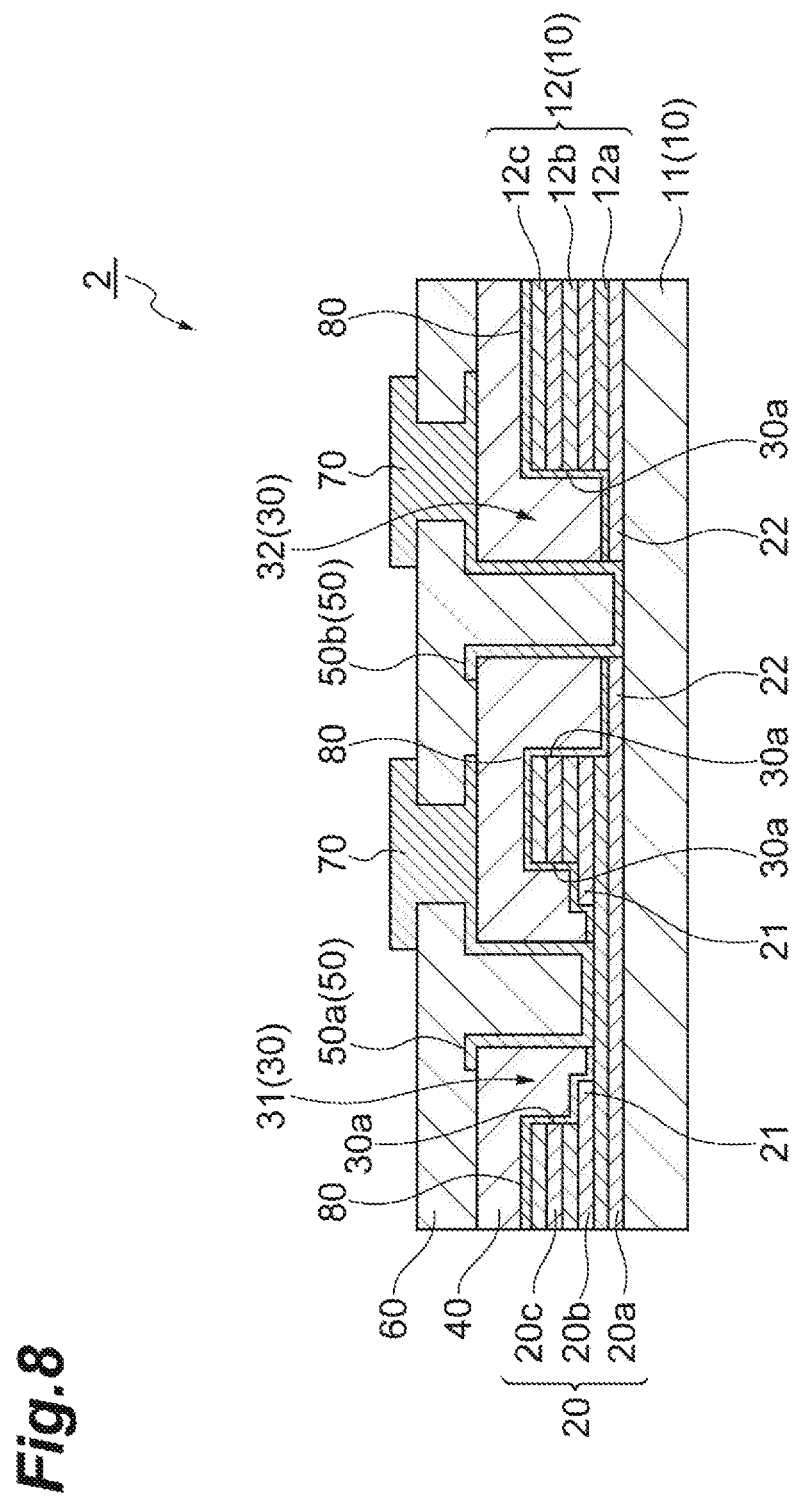
FIG. 8 is a cross-sectional view schematically illustrating a thin-film capacitor according to a modified example.

While an embodiment of the invention have been described above, the invention is not limited to the embodiment and can be modified in various forms. For example, a configuration in which a protective layer covering the dielectric layers and the electrode layers are formed separately may be employed. FIG. 8 is a cross-sectional view schematically illustrating a thin-film capacitor having a protective layer formed therein as a modified example. As illustrated in FIG. 8, the thin-film capacitor 2 further includes a protective layer 80 for protecting the electrode layers 10 and the dielectric layers 20. The protective layer 80 is disposed to cover the internal electrode layer 12c, the extension portion 21 of the dielectric layer 20b, the internal electrode layer 12a, the extension portions 21 and 22 of the dielectric layer 20a, and the side surfaces 30a of the opening portions 31 and 32. The protective layer 80 is formed of, for example, an insulating material such as $SiO_2$, alumina, or SiN (silicon nitride). By providing the protective layer 80 in this way, it is possible to prevent deterioration of the dielectric layers 20 due to moisture permeation or the like.

In the thin-film capacitor 1, three internal electrode layers 12a, 12b, and 12c and three dielectric layers 20a, 20b, and 20c are stacked, but the number of internal electrode layers 12 and the number of dielectric layers 20 are not particularly limited and can be arbitrarily changed. The electrode layer 10 which is electrically connected to the wiring portion 50 is not particularly limited.

A re-wiring layer which is electrically connected to the external terminal 70, the internal electrode layer 12, or the like may be further formed on the second insulating layer 60.

What is claimed is:

1. A thin-film capacitor comprising:
a plurality of electrode layers that are stacked in a stacking direction;
a plurality of dielectric layers that are stacked between the plurality of electrode layers;
an opening portion that includes a side surface penetrating at least a part of the plurality of electrode layers and at least a part of the plurality of dielectric layers in the stacking direction from a top side and a bottom surface exposing one electrode layer of the plurality of electrode layers; and
a wiring portion that is disposed in the opening portion to be separated from the side surface of the opening portion and is electrically connected to the electrode layer exposed from the bottom surface of the opening portion,
wherein the dielectric layer that is stacked immediately on the electrode layer exposed from the bottom surface of the opening portion among the plurality of dielectric layers includes an extension portion extending in the opening portion from the side surface of the opening portion to a wiring portion side,
the side surface of the opening portion has a continuous plane shape, and the extension portion extends from the side surface, and
a thickness of the extension portion is smaller than a thickness of the dielectric layer stacked immediately on the electrode layer exposed from the bottom surface of the opening portion.

2. The thin-film capacitor according to claim 1, wherein an end face of the extension portion is inclined such that a thickness of the extension portion decreases toward the wiring portion side.

3. The thin-film capacitor according to claim 1, wherein the extension portion reaches the wiring portion.

4. A thin-film capacitor comprising:
a plurality of electrode layers that are stacked in a stacking direction;
a plurality of dielectric layers that are stacked between the plurality of electrode layers;
an opening portion that includes a side surface penetrating at least a part of the plurality of electrode layers and at least a part of the plurality of dielectric layers in the stacking direction from a top side and a bottom surface exposing one electrode layer of the plurality of electrode layers; and
a wiring portion that is disposed in the opening portion to be separated from the side surface of the opening portion and is electrically connected to the electrode layer exposed from the bottom surface of the opening portion,
wherein the dielectric layer that is stacked immediately on the electrode layer exposed from the bottom surface of the opening portion among the plurality of dielectric layers includes an extension portion extending in the opening portion from the side surface of the opening portion to a wiring portion side,
the side surface of the opening portion has a continuous plane shape, and the extension portion extends from the side surface, and
an end face of the extension portion is inclined such that a thickness of the extension portion decreases toward the wiring portion side.

5. The thin-film capacitor according to claim 4, wherein the extension portion reaches the wiring portion.

* * * * *